United States Patent
Kinoshita

[19]
[11] Patent Number: 6,018,540
[45] Date of Patent: Jan. 25, 2000

[54] SEMICONDUCTOR LIGHT EMITTING ELEMENT AND OPTICAL FIBER TRANSMISSION SYSTEM

[75] Inventor: Junichi Kinoshita, Yokohama, Japan

[73] Assignee: Kabushiki Kaisha Toshiba, Kawasaki, Japan

[21] Appl. No.: 08/988,168

[22] Filed: Dec. 11, 1997

[30] Foreign Application Priority Data

Dec. 14, 1996 [JP] Japan .................................. 8-352665

[51] Int. Cl.⁷ .................................................. H01S 3/025
[52] U.S. Cl. ............................. 372/46; 372/29; 372/34
[58] Field of Search ................................ 372/46, 50, 34, 372/29; 257/80, 81, 79, 99

[56] References Cited

U.S. PATENT DOCUMENTS 5,825,047  10/1998  Ajisawa et al. ............................ 372/50

*Primary Examiner*—James W. Davie
*Attorney, Agent, or Firm*—Finnegan, Henderson, Farabow, Garrett & Dunner, L.L.P.

[57] ABSTRACT

Disclosed are a semiconductor light emitting element whose temperature characteristics are compensated for so as to provide a stable temperature characteristics in a temperature range from −40° C. to +85° C., and an optical fiber transmission system using the same semiconductor light emitting element. In the semiconductor light emitting element, an active layer (2) is buried on an n-type InP semiconductor substrate (1) formed with an n-side electrode (21). The upper layers (4, 5) are covered with an insulating film (22). A p-side electrode (20) is formed on the uppermost layer of the semiconductor substrate so as to cover the insulating film (22). A relatively large metallic resistance element (30) whose resistance increases with increasing temperature is wired on the insulating film (22) as a shunt path, so as to compensate for the temperature characteristics of the semiconductor light emitting element. Therefore, since leakage current is large at a low temperature, the threshold current is high, so that the slope efficiency is small. On the other hand, since leakage current is reduced at a high temperature, a rise in the threshold current and a drop of the slope efficiency can be both compensated for.

27 Claims, 8 Drawing Sheets

SEMICONDUCTOR LIGHT EMITTING ELEMENT AND OPTICAL FIBER TRANSMISSION SYSTEM

BACKGROUND OF THE INVENTION

1. Field of the Invention

The present invention relates to a semiconductor light emitting element, and more specifically to a semiconductor laser diode so controlled as to minimize a change of its light emission characteristics according to temperature. Further, the present invention relates to an optical fiber transmission system using the same semiconductor laser diode.

2. Description of the Prior Art

In semiconductor light emitting element, in particular in semiconductor laser, there often exists a problem related to its temperature characteristics. For instance, the threshold current ($I_{th}$) of diode lasers is sensitive to change in temperature. Here, since the semiconductor laser functions as a laser only when the driving current exceeds this threshold current ($I_{th}$), the temperature fluctuations of the threshold current is one of the important characteristics to be controlled.

In the field of optical communications, the application range has been extended from the state of the art ultrahigh speed optical communication systems for long distance and large capacity, through telecommunication systems of medrange, to data links for short distance. In these optical communication systems, the semiconductor lasers are used as a light source. In LED (light emitting diode), the spontaneous emission below the threshold current is used as the output. Because of a problem that the response speed is slow, the LED cannot be used for the high speed and large capacity communications. In contrast with this, the semiconductor laser has such an advantage that its response speed is much higher. However, semiconductor lasers have a problem related to the threshold current sensitivity to temperature. That is, the system using the semiconductor laser becomes relatively expensive in comparison with the LED. An APC (automatic power control) circuit, for instance is conventionally required to adjust the bias current responding to change of the threshold current. Further, in the case of a DFB (distributed feedback) type laser which can oscillate in single longitudinal mode, a thermoelectric cooler is needed for temperature control, with complicated external circuits.

In the age of multi-media, under such background that there exist explosive needs of the semiconductor lasers in the field of image data communications between optical subscriber systems and between personal computer systems, a semiconductor laser excellent in temperature characteristics and low in cost has been demanded more and more. Here, since the standard of the service range of temperature is so far −40° C. to 85° C., the less fluctuations in characteristics of the threshold current and the optical output (or SE: slope efficiency) are, the better will be the semiconductor laser.

In the semiconductor laser, the optical output $P_0$(W) from a facet at the operating current I can be expressed as follows:

$$P_0 = (\eta_d/2)(hv/q)(I - I_{th})(W)$$

where $v_d$: external differential quantum efficiency
h: Planck constant
v: photon frequency
q: electron charge
$I_{th}$: threshold current Further, the slope efficiency SE can be expressed as SE=increment of the optical output ($\Delta$Po)/increment of the current ($\Delta$I). If current vs. light output relation is linear, SE is equal to $(v_d/2)(hv/q)$.

Temperature characteristics of a prior art semiconductor laser will be described hereinbelow with reference to FIGS. 7 to 9, in which an InGaAsP/InP laser used for optical communications is shown by way of example.

FIG. 7 is a cross-sectional view showing an FP (Fabry-Perot) type laser using an InGaAsP/InP semiconductor, which is taken along an axial direction thereof. This semiconductor light emitting element can be formed as follows:

First, on an N-type InP semiconductor substrate 1, a multiple quantum well (MQW) active layer 2 of InGaAsP crystal is grown. On this MQW active layer 2, a p-InP layer 4 and a p-InGaAsP ohmic contact layer 5 are grown successively. After that, a buried-hetero (BH) type waveguide structure is formed by mesa-etching the active layer 2 into a stripe shape and further by forming current blocking regions on either side of the stripe-shaped active layer 2. FIG. 9 is a perspective view showing this waveguide structure, in which a mesa structure is formed into a stripe shape on the first principal plane of the semiconductor substrate 1. On the top surface of the mesa portion, a stripe-shaped active layer 2 is formed. Further, a p-InP buried layer 6 and an n-InP burying layer 7 are grown successively on the bottom portion on either side of the active layer 2. Here, since the current is blocked by the reverse junction at the boundary between the burying layers 6 and 7, the current flows only through the stripe-shaped active layer 2.

The electrode 20 is formed on the semiconductor layer 5 formed on the first principal plane of the semiconductor substrate 1. The electrode 21 is formed on the second principal plane of the same semiconductor substrate 1. Further, the surface (opposite side to the optical output side) on the rear facet is coated with a highly reflective film structure, in order to reduce the threshold current and to increase the slope efficiency of the light outputted from the front side.

FIG. 8 is a cross-sectional view showing a DFB type semiconductor laser using an InGaAsP/InP semiconductor. In this DFB type laser, on an n-type InP semiconductor substrate 1, an InGaAsP-MQW active layer 2 and an InGaAsP waveguide layer 3 having a band gap larger than that of the active layer 2 are laminated. Further, a grating 15 is formed on the waveguide layer 3. This grating 15 serves to allow the semiconductor laser to be advantageously feedbacked with the longitudinal mode corresponding to the period of the grating itself, so that the oscillation can be achieved easily in the single longitudinal mode. A grating phase shift 16 which corresponds to λ/4 (λ: wavelength in the waveguide) is formed at just a middle portion of the resonator of the grating 15. Owing to the presence of this phase shift 16, the oscillation in the single longitudinal mode can be further facilitated. Further, in the case of the λ/4 phase shift DFB type laser, an AR (anti-reflection) coat 31 is formed on both end facets thereof, to suppress the unnecessary FP mode. Further, a p-InP layer 4 and a p-InGaAsP ohmic contact layer 5 are grown on the grating 15 and the phase shift 16. After that, the semiconductor substrate is mesa-etched into a stripe shape, to produce a BH type waveguide structure the same as shown in FIG. 9. Further, two current injecting electrodes 20 and 21 are formed on the semiconductor layer 5 formed on the first principal plane of the semiconductor substrate 1 and the second principal plane of the same semiconductor substrate 1, respectively.

The above-mentioned two prior art semiconductor light emitting elements have some problems as follows:

(1) Temperature dependence of both threshold current and slope efficiency

FIG. 10 shows the temperature dependence of the current versus optical output characteristics of the FP type InGaAsP/InP laser having the MQW active layer 2 so designed as to be oscillated at 1.3 μm wavelength band. As shown in FIG. 10, the threshold current ($I_{th}$) of 5 mA at room temperature increases up to 12 mA at 8520 C. Further, the slope efficiency (optical output) decreases by 20–30%. FIG. 10 indicates that the temperature dependence of the optical output at a constant bias current larger than the threshold current becomes further violent, because of the change of the threshold current. Therefore, it is difficult to realize a laser device which does not need any APC circuit.

(2) Temperature characteristics of DFB type laser In the case of the DFB type laser, there exists the case where the threshold current rises due to spatial hole burning in addition to the above-mentioned change. The axial hole burning occurs due to the non-uniformity of photon density along the axial direction thereof.

Once a deviation occurs in photon density, the carrier density distribution also deviates according to the photon density deviation. The change of carrier density causes the change of refractive index of the active layer due to the plasma effect, for instance. In other words, the change of refractive index results in the change of the waveguide structure itself of the DFB laser. Therefore, the phase condition of the laser oscillation changes and thereby the longitudinal mode changes continuously. In the case of the λ/4 phase shift DFB type laser, there exists such a tendency that the light is extremely concentrated at the middle of the resonator, that is, at the λ/4 phase shift position. FIG. 11 shows an example of the axial distributions of both the photon density S(z, t) and the carrier density N(t) at κL=2, where κ denotes the coupling factor and L denotes the resonator length. Further, κ depends upon the grating depth and represents a quantity indicative of a light feedback amount of the grating.

The hole burning depends upon the distribution of the density, so that the larger the absolute values of the photon density and the carrier density are, the stronger will be the influence thereof upon the hole burning. For instance, when temperature rises, the threshold carrier density increases, so that the hole burning increases to that extent. In other words, the refractive index changes in such a way as to further cancel out the effect of the λ/4 phase shift. Besides, since of the λ/4 phase shift makes the phase condition on which the threshold current is minimized, an offset of the phase shift away from this λ/4 causes a further increase of the threshold current. Therefore, in the DFB type laser, there exists a tendency that the temperature characteristics further deteriorate due to the vicious cycle caused by the hole burning.

SUMMARY OF THE INVENTION

With these problems in mind, therefore, it is the object of the present invention to provide a semiconductor light emitting element and an optical fiber transmission system using the same semiconductor light emitting element, whose temperature characteristics are compensated for to obtain stable characteristics in a wide temperature range from −40° C. to 85° C. In particular, it is possible to realize a semiconductor light emitting element whose temperature change of the oscillation threshold current can be minimized to eliminate any APC circuit. As a result, it is possible to provide a low-cost semiconductor light emitting element by simplifying an external circuit for controlling the same element.

To achieve the above-mentioned object, the present invention provides a semiconductor light emitting element, comprising: a semiconductor substrate (1); a plurality of semiconductor layers including an active layer (2) and formed on a first principal plane of said semiconductor substrate (1); a first electrode (20) formed on a surface of one of said semiconductor layers; a second electrode (21) formed on a second principal plane of said semiconductor substrate (1); and a shunt path (30) connected in parallel with current injected to emit light from the active layer (2), in such a way as to compensate for light emission characteristics of the active layer (2).

Here, it is preferable that the semiconductor light emitting element further comprises a waveguide (3) having a grating (15), and wherein said shunt path (30) is formed being branched from a part of said waveguide (3) for constituting a resonator; and a difference in refractive index caused by a difference between carrier density at the part of said waveguide (3) and carrier concentration of said waveguide (3) at positions other than the part can function as an effective phase shift for the grating (15), in such a way that temperature change of light emission characteristics of the semiconductor light emitting element can be compensated for by temperature change rate of the effective phase shift.

Further, it is preferable that the semiconductor light emitting element further comprises a waveguide (3) having a grating (15), and wherein said shunt path (30) is formed being concentrated at a part of said waveguide (3) for constituting a resonator; and a difference in refractive index caused by heat generated by said shunt path (30) between the part of said waveguide (3) and positions other than the part of said waveguide can function as an effective phase shift for the grating (15), in such a way that temperature change of light emission characteristics of the semiconductor light emitting element can be compensated for by temperature change of the effective phase shift rate.

Further, it is preferable that the semiconductor light emitting element further comprises a waveguide (3) having a grating (15), and wherein an effective phase shift is generated for the grating (15) by forming a cutout portion in said active layer (2) in a direction of said waveguide (3); and the effective phase shift rate is further changed by causing change of carrier density of said active layer (2) to produce change of a difference in refractive index between said active layer (2) and the cutout portion of said active layer, in such a way that temperature change of light emission characteristics of the semiconductor light emitting element can be compensated for by temperature change of the effective phase shift rate.

Further, it is preferable that the semiconductor light emitting element further comprises a waveguide (3) having a grating (15), and wherein an effective phase shift is generated for the grating (15) by forming a part of an active layer region where current is not injected in a direction of said waveguide (3); and the effective phase shift rate is further changed by causing change of carrier density of said active layer (2) to produce change of a difference in refractive index between the active layer and the active layer region where current is not injected, in such a way that temperature change of light emission characteristics of the semiconductor light emitting element can be compensated for by temperature change of the effective phase shift rate.

Further, it is preferable that the semiconductor light emitting element further comprises a waveguide (3) having quadratic gratings (151).

Further, it is preferable that change of the phase shift rate generated finally by said shunt path (30) is so controlled as to compensate for temperature change of oscillation threshold value of the semiconductor light emitting element.

Further, it is preferable that change of the phase shift rate generated finally by said shunt path (30) is so controlled as to compensate for temperature change of intensity of light outputted by the semiconductor light emitting element.

Further, it is preferable that an optical transmission unit having a semiconductor light emitting element as defined the appended claim; and an optical reception unit.

The semiconductor light emitting element according to the present invention is characterized in that in order to reduce the temperature dependency of the threshold current and the slope efficiency (SE) of the FP (Fabry Perot) or DFB (distributed feedback) type semiconductor laser, leak current flowing in parallel (shunt) to the active layer is utilized. In other words, the temperature characteristics of the semiconductor light emitting element can be compensated for by wiring a relatively large metallic resistance element as a shunt path. Here, the resistance of the metallic resistance element increases with increasing temperature. At a low temperature, since leak current is large, the threshold current is large, so that the slope efficiency is small. At a high temperature, however, since the leak current can be reduced, it is possible to compensate for an increase of the threshold current and a decrease of the slope efficiency.

Further, the phase shift rate at a low temperature is set to a value offset away from the minimum threshold current, in such a way that the low threshold current can be obtained at a high temperature. By doing this, the partial change of the axial carrier density causes a change of the refractive index, so that a change of the effective phase condition can be produced. When an effective phase shift is required to be caused, a leak path of the shunt is formed at a position electrically independent to some extent, and the carrier density at this position is changed, to obtain means for compensating for the effective phase shift rate.

Further, in the case of the DFB type laser structure in which an effective phase shift region can be formed by simply removing the active layer, the shift rate at a low temperature is set in such a way that a relative change of the refractive index to the portion where the active layer is removed (which is caused by the temperature change of the carrier density at the portion where the active layer is not removed) causes a phase shift change for compensating for an increase of the threshold current.

Further, in the DFB type laser structure in which an effective phase shift portion can be formed simply by injecting no current into the active layer, the shift rate at a low temperature is set in such a way that a relative change of the refractive index to the portion where the current is not injected (which is caused by the temperature change of the carrier density at the portion where the current is injected) causes a phase shift change for compensating for an increase of the threshold current.

Further, in general, the change of the phase shift can compensate for the threshold current, but cannot compensate for the slope efficiency. This is because even if Q value of the resonator increases and thereby the threshold current decreases, the output efficiency from the end surface decreases. However, in the case of the grating-coupled type surface light emitting DFB type laser using second-order gratings, since the light emitted from a large optical output region is used, it is also possible to compensate for the slope efficiency.

As described above, in the semiconductor light emitting element according to the present invention, the temperature dependency of the semiconductor laser can be compensated for. That is, the apparent threshold current can be increased by holing the actual threshold current at a low level by use of a leak path formed in the shunt path. Here, since the resistance of the shunt path increases with increasing temperature, the leak can be reduced at a high temperature, so that it is possible to suppress a rise of the apparent threshold current. As a result, the bias current can be easily set whenever the laser is driven. Further, since the fluctuations of the apparent threshold current can be reduced, the set margin of the APC (automatic power control) circuit can be increased or the APC can be eliminated. Further, in the case of the DFB type laser, the compensation can be achieved in such a way that the temperature change of the effective phase shift rate can prevent the threshold current or the slope efficiency from deteriorating due to temperature change. Further, in the GCSEL (grating coupled surface emitting laser) using the second-order gratings, it is possible to compensate for both the threshold current and the slope efficiency by compensation based upon the change of the phase shift.

DETAILED DESCRIPTION OF THE PREFERRED EMBODIMENTS

Embodiments of the present invention suitable for use as InGaAsP/InP FP (Fabry Perot) type and DFB (distributed feedback) type semiconductor lasers will be described hereinbelow with reference to the attached drawings.

1st Embodiment

Figure 1:
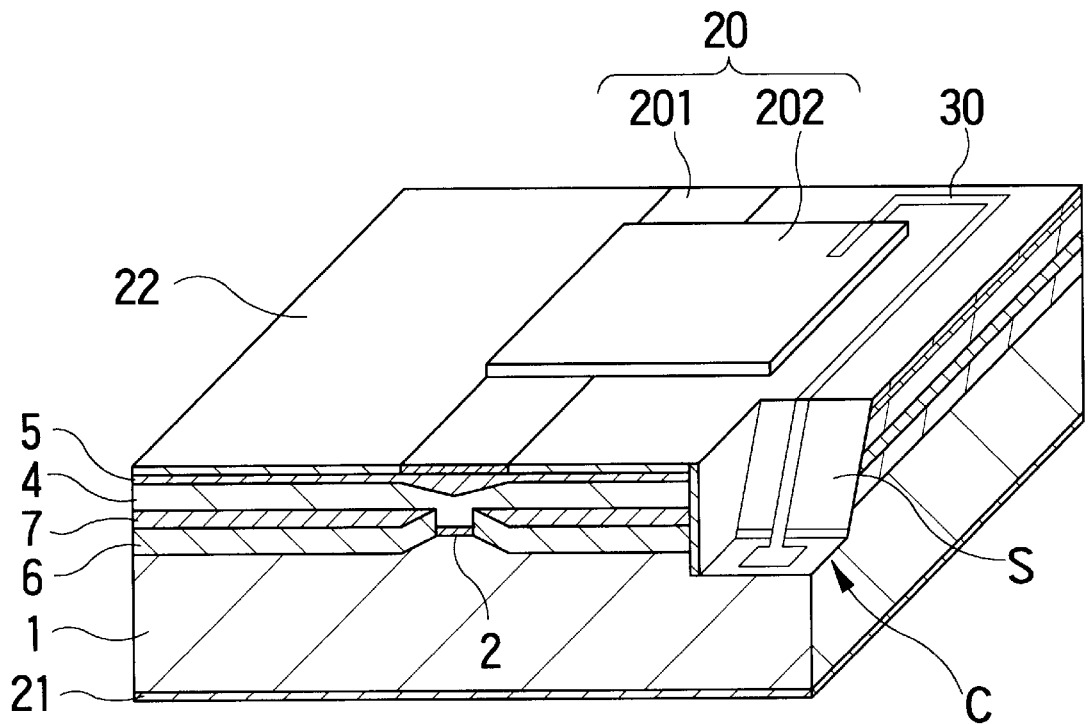
FIG. 1 is a perspective view showing a first embodiment according to the present invention, in which an FP (Fabry Perot) type semiconductor laser formed with a shunt path is shown.

FIG. 1 is a perspective view showing the first embodiment, in which a basic structure of the FP type semiconductor laser using an InGaAsP/InP semiconductor is shown.

First, in this semiconductor light emitting element, on an N-type InP semiconductor substrate 1, a multiple quantum well (MQW) active layer 2 of InGaAsP crystal is grown. On this MQW active layer 2, a p-InP layer 4 and a p-InGaAsP ohmic contact layer 5 are formed. This active layer 2 is mesa-etched into a stripe shape, and further a current blocking region is formed on both sides of the tripe-shaped active layer 2, to form a buried-hetero (BH) type waveguide structure. In other words, a mesa structure is formed into a stripe-shape on the first principal plane of the semiconductor substrate 1, and the stripe-shaped active layer 2 is formed on the top portion of the formed mesa. Further, a p-InP buried layer 6 and an n-InP buried layer 7 are formed in sequence on the bottom plane of this stripe-shaped active layer 2. Here, since current is blocked by the backward junction at the boundary between the buried layers 6 and 7, the injected current flows only through the stripe-shaped active layer 2.

The electrode 20 is formed on the semiconductor layer 5 formed on the first principal plane of the semiconductor substrate 1. The electrode 21 is formed on the second principal plane of the semiconductor substrate 1. The first electrode 20 formed on the contact layer 5 is a p-side electrode, which is composed of an electrode portion 201 directly in contact with the contact layer 5 and a bonding pad portion 202. The electrode portion 201 is formed of AuZn, and the electrode width is 5 $\mu$m. On the other hand, the bonding pad portion 202 is composed of a Ti—Pt film and a Au film formed on the Ti—Pt film. Further, the portion of the contact layer 5 not covered with the electrode 201 is covered with an insulating film 22 of SiO$_2$, for instance. The bonding pad portion 202 is electrically connected to the electrode portion 201, which extends onto the insulating film 22. The second electrode 21 formed on the second principal plane of the semiconductor substrate 1 is formed all over the lower surface of the substrate 1, which is formed of AuGe.

The feature of the present invention is to form a shunt path 30 of metallic resistance element on the insulating film 22 in such a way that the bonding pad portion 202 can be electrically connected to the semiconductor substrate 1. In the metallic resistance element, the current flowing through it decreases with increasing temperature. The shunt path 30 is a thin film resistance formed of platinum which is formed so as to be arranged in electrically parallel (shunt) to the stripe-shaped active layer 2. The corner portions of the respective semiconductor layers formed on the first principal plane of the semiconductor substrate 1 and the insulating film 22 formed thereon are all removed by etching so as to form a cutout portion C. In this cutout portion C, a part of the semiconductor substrate 1 is exposed. The side surfaces of the semiconductor layers extending from the exposed substrate portion to the surface of the insulating film 22 are covered with a SiO$_2$ film, and a part of the side surfaces thereof is a slope surface S of (111) A plane.

The shunt path 30, that is, the thin film resistance extends from the bonding pad portion 202, through the surface of the insulating film 22 and the slope surface S of (111) A plane, to the n-InP semiconductor substrate 1. Since the adhesion strength of Pt of the shunt path 30 to the SiO$_2$ film 22 is not sufficient, a very thin titanium (Ti) (not shown) is formed so as to intervene between Pt and SiO$_2$ as a base metal film, so that a adhesion strength can be secured. The temperature dependency of Pt resistivity ($\rho$) can be expressed as follows:

$$\rho(\Omega cm)=[9.81+0.038\times T(^\circ C.)]\times 10^{-8} \qquad (1)$$

Therefore, R ($\Omega$) can be expressed as $$R(\Omega)=\rho(\Omega cm)\times l(m)/a(m^2) \qquad (2)$$

where l denotes the length of the thin film resistance element, and "a" denotes the cross-sectional area thereof. When the width of the thin film resistance element is 2.5 $\mu$m and the thickness thereof is 0.2 $\mu$m, the cross-sectional area "a" is 0.5 $\mu m^2$. If the length l of the thin film resistance element is 250 $\mu$m, the resistance R thereof can be expressed as follows:

$$R(\Omega)=[9.81+0.038\times T(^\circ C.)]\times 10^{-2}(\Omega\mu m)\times 500(\mu m^-) \qquad (3)$$

On the basis of the formula (3), R=53 $\Omega$ at 25° C.

Since the InGaAsP/InP laser of 1.3 $\mu$m wavelength band can oscillates at the bias voltage of 1.2 V, the current flowing through the thin film resistance element is a leakage current of 1.2/53=23 mA. At 8520 C., since R=65 $\Omega$, the current flowing through the thin film resistance element is a leakage current of 1.2/63=18 mA.

Figure 10:
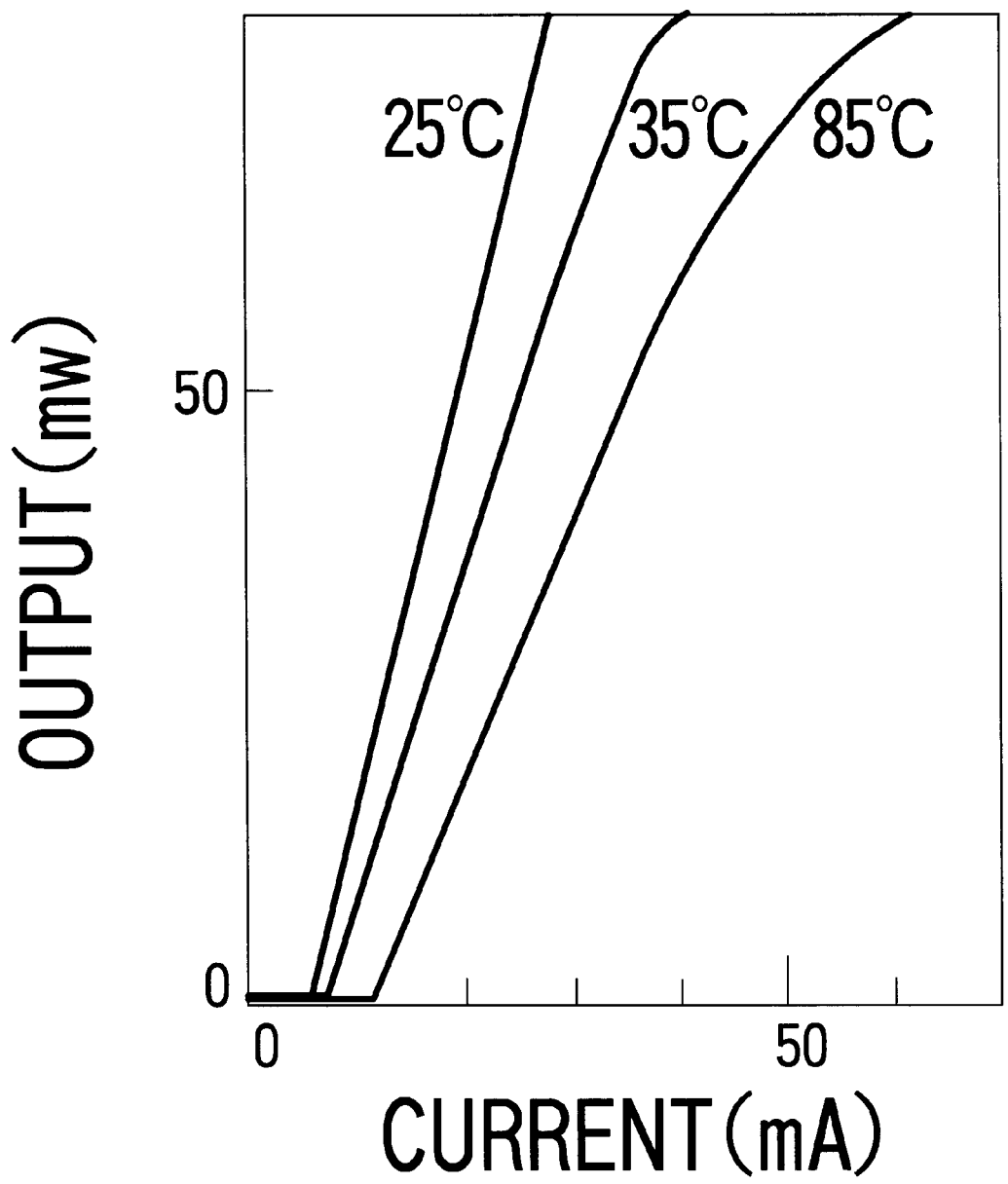
FIG. 10 is a temperature characteristic diagram between current and optical output of the prior art FP type semiconductor laser shown in FIG. 7.
Figure 11:
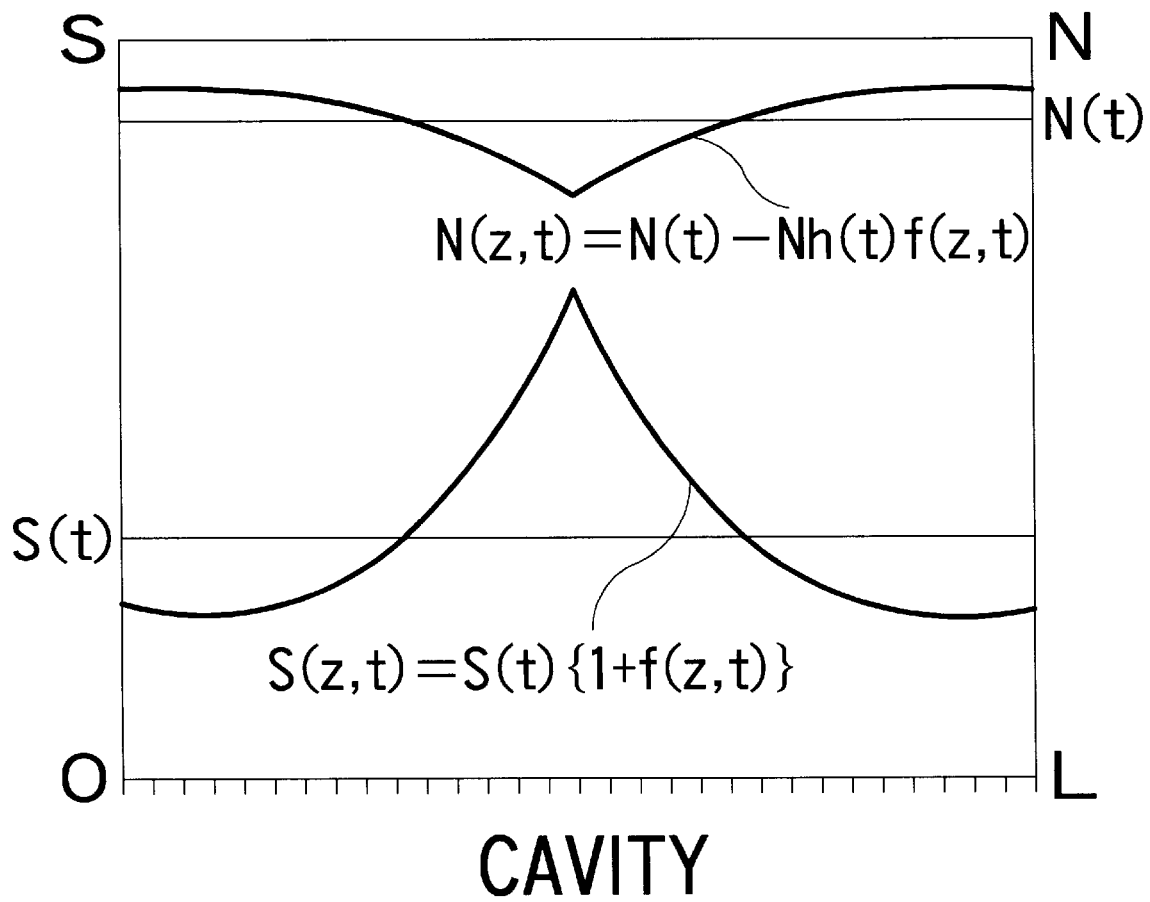
FIG. 11 is a diagram showing the axial distributions of the light intensity and the carrier density of the DFB type semiconductor laser.

The leakage current flows through the shunt path 30. On the other hand, the current flowing through the active layer 2 is 5 mA at 25° C. and 12 mA at 85° C., respectively as shown in FIG. 10, which is the current versus optical output characteristics of the prior art FP type semiconductor laser. Therefore, the apparent threshold current ($I_{th}$) including the shunt leakage is 5+23=28 mA and 12+18=30 mA at respective temperatures, so that the increment of the apparent threshold current is as small as 2 mA (only 7%) between 25° C. and 85° C. In contrast with this, in the prior art FP type semiconductor laser, an increase of the threshold current is as large as (2–5)/5=1.4, that is, 140% between 25° C. and 85° C. Eventually, in the semiconductor laser according to the present invention, it is possible to reduce the fluctuation ratio of the threshold current apparently.

On the other hand, the slope efficiency is decreased by the current leakage. The slope efficiency at 25° C. without leakage is 0.22 W/A. The voltage applied to the active layer is fixed at the threshold voltage ($V_{th}$) of the active layer above threshold current. As a result, the active layer can be simulated to be equivalent to a resistance in circuit-modeling. Eventually the current flowing through the active layer ($I_{active}$) and the current flowing through the shunt path ($I_{leak}$) above threshold can be obtained simply by using the resistance ratio between both. If the series resistor to the active layer and the shunt path resistor are assumed to be 5 $\Omega$ and 53 $\Omega$ respectively, the apparent current ($I-I_{th}$) can be expressed as $$I-I_{th}=I_{active}+I_{leak}=I_{active}\cdot(5+53)/53=1.09\ I_{active}$$

Accordingly, the slope efficiency at 25° C. with the current leakage is expressed as follows:

$$0.22/1.09=0.20(W/A).$$

On the other hand, the slope efficiency at 8520 C. without leakage is about 0.18 W/A. If the resistance through the active layer is 5 $\Omega$ and the resistance of the shunt path is 65 $\Omega$, the apparent current ($I-I_{th}$) can be expressed in the same way as follows:

$I-I_{th}=I_{active}+I_{leak}=I_{active}\cdot(5+65)/65=1.07I_{active}.$

Accordingly, the slope efficiency at 85° C. with the leakage current is expressed as follows:

0.18/1.07=0.17(W/A).

Therefore, the ratio of the slope efficiency can be improved from 18%((0.22−0.18)/0.22) to 15%((0.2−0.17)/0.2), so that some compensation can be attained.

Figure 2:
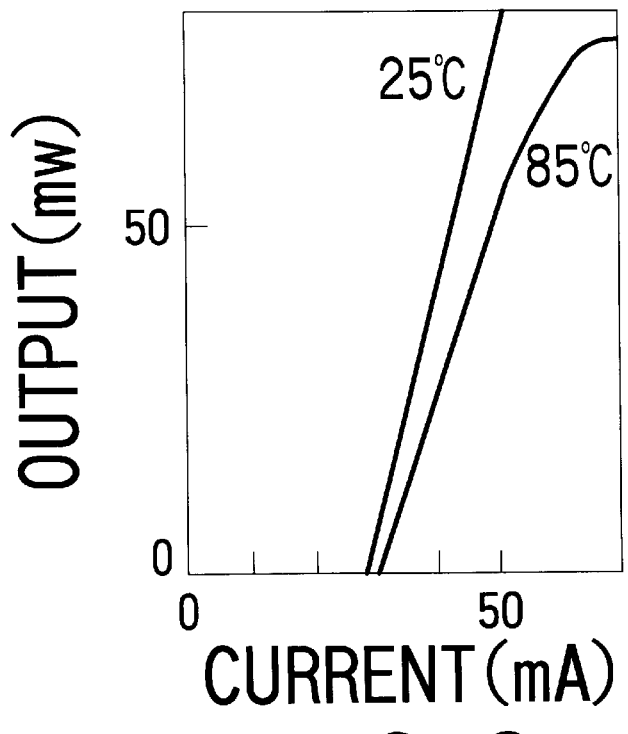
FIG. 2 is a temperature characteristic diagram between current and optical output of the FP type semiconductor laser shown in FIG. 1.

FIG. 2 shows a temperature dependence of the current versus optical output characteristics obtained by the present invention, which indicates that the change rate of the threshold current ($I_{th}$) according to temperature change is reduced. For instance, even if the semiconductor laser is drived at the bias current of 26 mA without use of any APC (automatic power control) circuit, since the current of 26 mA is sufficiently near to the threshold current, the time delay of the oscillation is substantially small, so that it is possible to transmit optical signals having excellent waveforms without generating any jitter (fluctuations). Moreover, since the APC circuit is not required or the margin thereof can be improved, it is possible to reduce the cost of the system itself markedly.

2nd Embodiment

Figure 3:
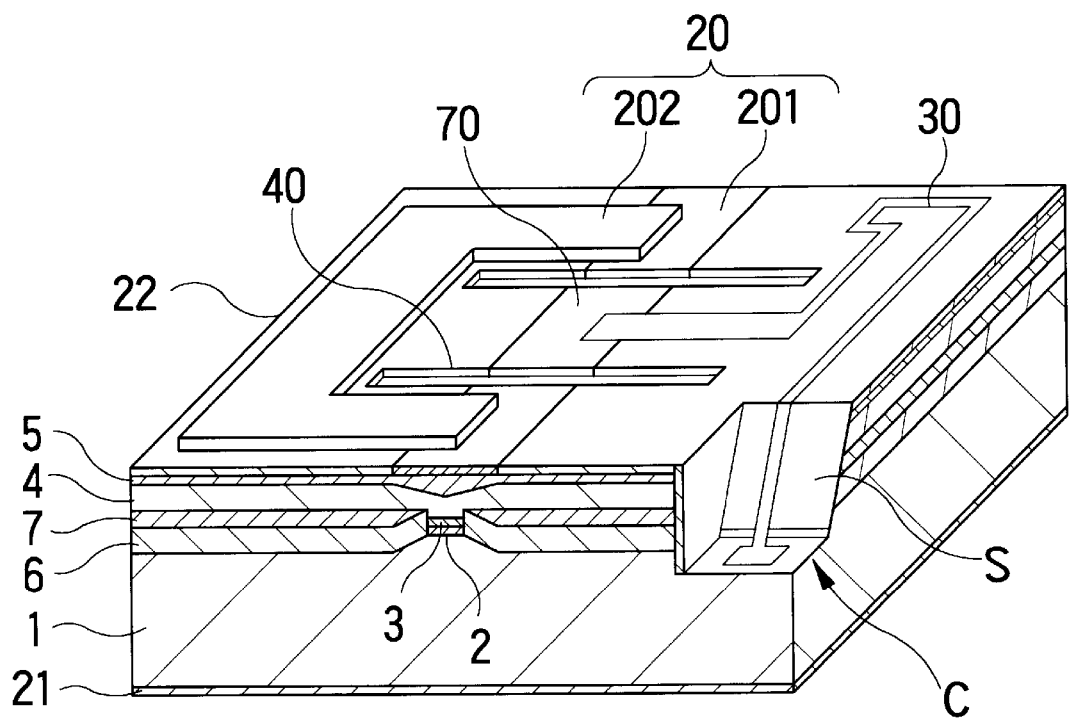
FIG. 3 is a perspective view showing a second embodiment according to the present invention, in which a DFB (distributed feedback) type semiconductor laser formed with a shunt path is shown.
Figure 8:
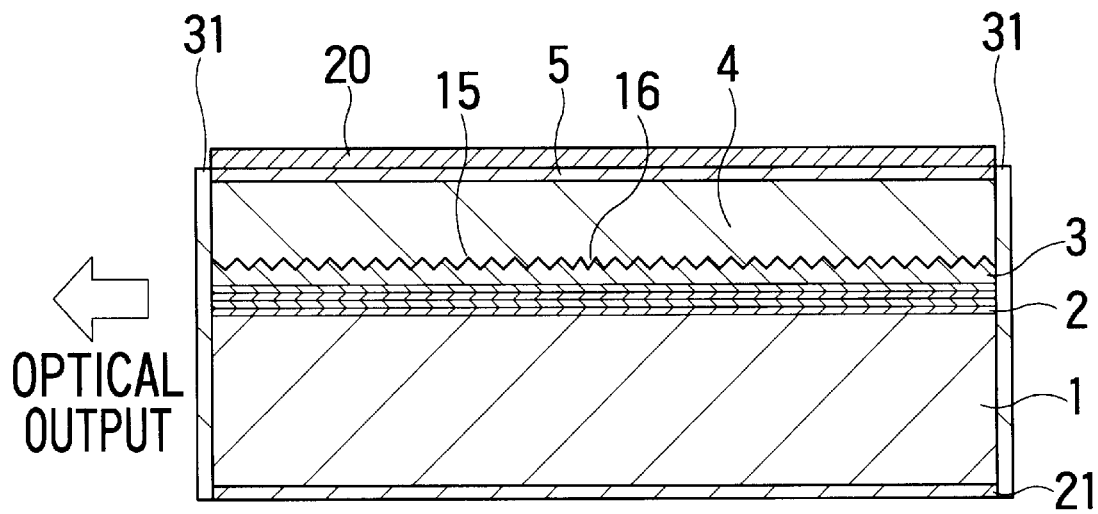
FIG. 8 is a cross-sectional view showing a prior art DFB type laser.

FIG. 3 is a perspective view showing the second embodiment, in which a DFB type semiconductor laser using an InGaAsP/InP semiconductor used for optical communications is shown. FIG. 8 can be also used for reference with respect to the similar sections or parts of the laser.

Figure 9:
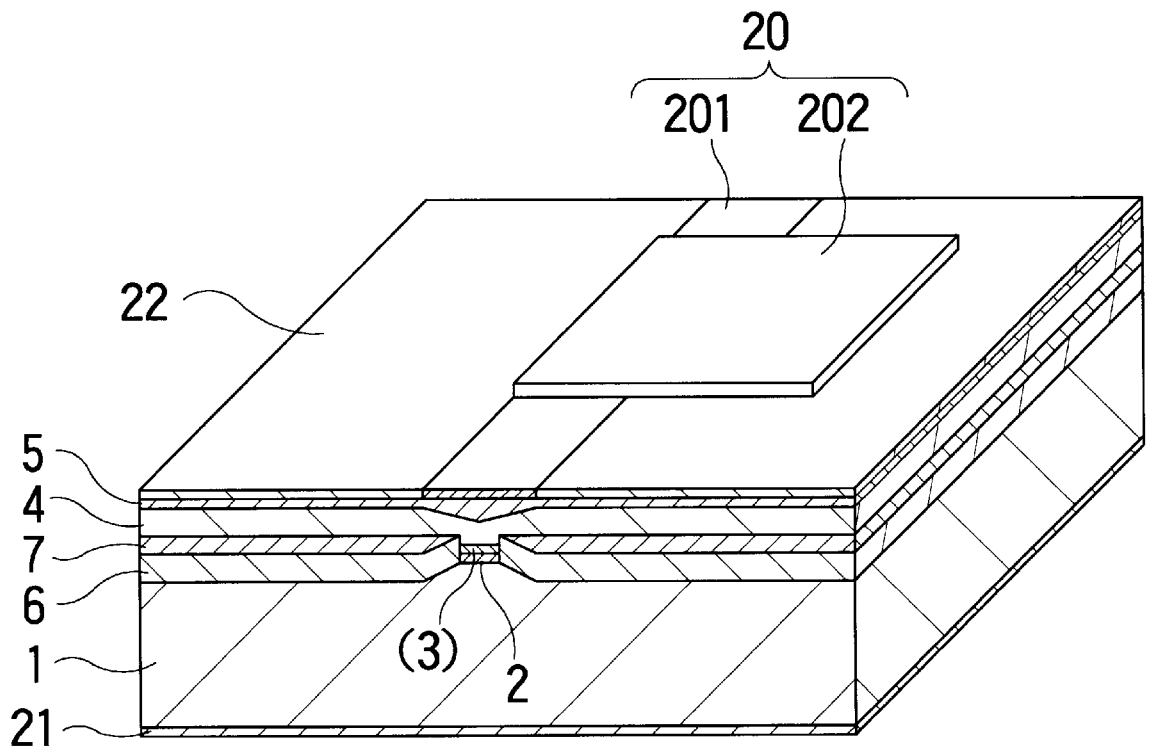
FIG. 9 is a perspective view showing the FP type semiconductor laser shown in FIG. 7.

With reference to FIG. 3 and FIG. 8, a mesa structure is formed into a stripe shape on the first principal plane of the semiconductor substrate 1. On this top surface of the mesa portion, a stripe-shaped active layer 2 is formed. Further, a p-InP buried layer 6 and an n-InP buried layer 7 are formed in sequence on the bottom portion on both sides of the active layer 2. Here, since current is blocked by the reverse junction at the boundary between the buried layers 6 and 7, the injected current flows only through the stripe-shaped active layer 2. In this DFB type laser, an InGaAsP-MQW active layer 2 and an InGaAsP waveguide layer 3 having a band gap larger than that of the active layer 2 are laminated on an n-type InP semiconductor substrate 1. Further, a grating 15 is formed on the waveguide layer 3, as shown in FIG. 8. This grating 15 serves to allow the semiconductor laser to be selectively feedbacked to the longitudinal mode corresponding to the period of the grating itself, so that the oscillation can be achieved easily in the single longitudinal mode. A grating phase shift 16 which corresponds to λ/4 (λ: wavelength in the waveguide) is formed at just a middle portion of the resonator of the grating 15, also as shown in FIG. 8. Owing to the presence of this phase shift 16, the laser oscillation in the single longitudinal mode can be further facilitated. Further, in the case of the λ/4 phase shift DFB type laser, an AR (anti-reflection) film 31 is formed on both facets thereof, to suppress the spurious FP mode. Further, a p-InP layer 4 and a p-InGaAsP ohmic contact layer 5 are laminated in sequence on the grating 15 and the phase shift 16. Then the semiconductor substrate is mesa-etched into a stripe shape, to form a BH (buried-hetero) type waveguide structure the same as shown in FIG. 9. Further, the electrodes 20 and 21 are formed on the semiconductor layer formed on the first principal plane of the semiconductor substrate 1 and the second principal plane of the semiconductor substrate, respectively. The first electrode 20 formed on the contact layer 5 is a p-side electrode, which is composed of an electrode portion 201 directly in contact with the contact layer 5 and a bonding pad portion 202. The electrode portion 201 is formed of AuZn, and the electrode width is 5 µm. On the other hand, the bonding pad portion 202 is composed of a Ti—Pt film and an Au film formed on the Ti—P film. Further, the portion not covered with the electrode portion 201 of the contact layer 5 is covered with an insulating film 22 of $SiO_2$, for instance. The bonding pad portion 202 is electrically connected to the electrode portion 201, which extends onto the insulating film 22. The second electrode 21 formed on the second principal plane of the semiconductor substrate 1 is formed all over the substrate surface and formed of AuGe.

The feature according to the present invention is to form a shunt path 30 of metallic resistance element on the insulating film 22 in such a way that the bonding pad portion 201 can be electrically connected to the semiconductor substrate 1. In the metallic resistance element, current flowing through it decreases with increasing temperature. The shunt path 30 is a thin film resistance formed of platinum (Pt), which is formed so as to be arranged in electrically parallel (shunt) to the stripe-shaped active layer 2. The corner portions of the respective semiconductor layers formed on the first principal plane of the semiconductor substrate 1 and the insulating film 22 formed thereon are all removed by etching so as to form a cutout portion C. In this cutout portion C, a part of the semiconductor substrate 1 is exposed. The side surfaces of the semiconductor layers from the exposed portion to the surface of the insulating film 22 are covered with a $SiO_2$ film, and a part of the side surface thereof is a slope surface S. The shunt path 30, that is, the thin film resistance extends from the bonding pad portion 201, through the surface of the insulating film 22 and slope surface S, to the n-InP semiconductor substrate 1. Here, since the adhesion strength of Pt of the shunt path 30 to the $SiO_2$ film 22 is not sufficient, a very thin titanium (Ti) (not shown) is formed so as to intervene between Pt and $SiO_2$ as a base metal film.

The resonator is divided into three sections, and these three sections are insulated electrically from each other. In more detail, the p-side electrode 20 is divided into three sections and insulated from each other by forming two grooves 40 each having such a depth as not to obstruct the waveguided light in the vicinity of the active layer. The shunt path (i.e., thin metallic film) 30 is connected to only the middle electrode portion thereof. Further, the phase shift is not formed at the middle portion of the p-side electrode portion 201.

Leakage current tends to flow from the thin film resistance 30 to the resonator middle portion 70 of the electrode portion 201, so that the carrier density is reduced and thereby the refractive index increases at the middle portion 70 of the resonator in comparison with the peripheral portion thereof. An increase of the refractive index causes this middle portion 70 of the resonator to be an effective phase shift region. The length of this middle region is so determined that the phase shift rate at a low temperature may be less than λ/4. On the other hand, the threshold carrier density rises at a high temperature. Therefore, the refractive index at the region into which current is injected without any leakage decreases more and more. In contrast with this, since the change of the carrier density is small at the middle portion, because current is not injected or current leaks, so that the change of the refractive index is small (if the carrier density is large, the refractive index is small). As described above, since there exists a large difference in refractive index between the middle portion and the peripheral portion thereof, the absolute amount of the effective phase shift increases up to λ/4. In general, the dependency of the threshold current upon the phase shift is minimized when the phase shift is at λ/4. Accordingly, an increase of the threshold current due to the rise in temperature can be compensated for by the change of the phase shift. In this case, however, the optical output (or slope efficiency) decreases. This is because the optical output is minimized at the λ/4 phase shift. Therefore, when the optical output is required to be compensated for without taking notice of a rise of the threshold current, the phase shift at a low temperature is set to be λ/4 in such a way that the phase shift at a higher temperature becomes larger than that at a low temperature. In this way, the optical output can be compensated for.

As described above, since there exists trade-off relationship between the threshold current and the optical output, it is impossible to compensate for both at the same time in the structure of this embodiment.

3rd Embodiment

Figure 4:
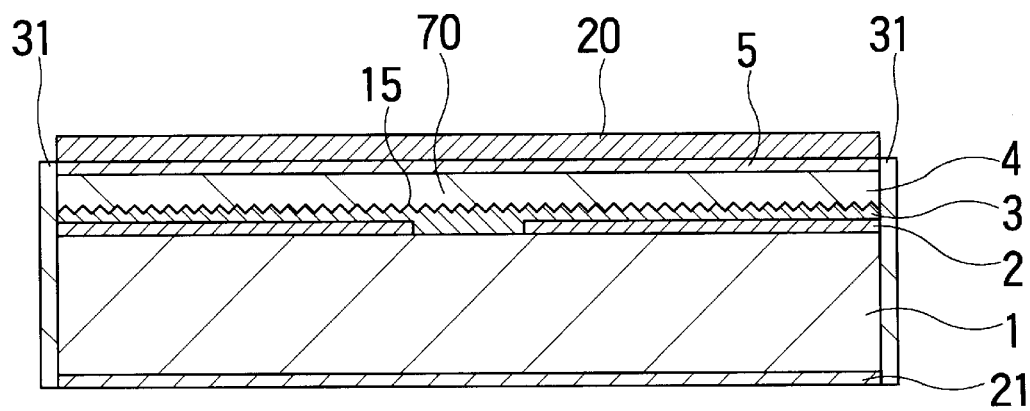
FIG. 4 is a cross-sectional view showing a third embodiment according to the present invention, in which an effective phase shift DFB type semiconductor laser is shown.

FIG. 4 is a cross-sectional view showing the third embodiment, in which the active layer is removed at the middle resonator portion to left only the waveguide. This third embodiment is a modified DFB type semiconductor laser. In this DFB type laser, an InGaAsP-MQW active layer 2 and an InGaAsP waveguide layer 3 having a band gap larger than that of the active layer 2 are laminated on an n-type InP semiconductor substrate 1. Further, a grating 15 is formed on the waveguide layer 3, as shown. This grating 15 serves to allow the semiconductor laser to be selectively feedbacked to the longitudinal mode corresponding to the period of the grating itself, so that the oscillation can be achieved easily in the single longitudinal mode. In the case of the λ/4 phase shift DFB type laser, an anti-reflective film (AR film) is formed on both facets thereof to suppress the spurious FP mode. Further, a p-InP layer 4 and a p-InGaAsP ohmic contact layer 5 are laminated in sequence on the grating 15. After that, the semiconductor substrate is mesa-etched into a stripe shape, to form a BH (buried-hetero) type waveguide structure. Further, two current injecting electrodes 20 and 21 are formed on the semiconductor layer formed on the first principal plane of the semiconductor substrate 1 and the second principal plane, respectively.

When the current is not intended to be injected into the active layer, it is preferable to remove the active layer. In such a case, the middle portion 70 of the resonator can function as the phase shift region, when the active layer 2 is removed and the waveguide layer 3 is formed thereat, since the effective refractive index at the middle portion 70 of the resonator is reduced in comparison with the periphery thereof. In this phase shift region, the change of the refractive index due to the change of carrier density can be negligible. Therefore, even if the refractive index changes according to the change of the threshold carrier density in the peripheral region in which the active layer exists, the refractive index of the resonator middle portion 70 hardly changes. In other words, the relative refractive index changes according to the threshold carrier density, so that the phase shift rate changes. In this case, the amount of the phase shift is set to a value larger than λ/4 at a low temperature. By doing this, a rise of the threshold current according to the temperature can be compensated for by the change of the threshold current due to change of the phase shift.

4th Embodiment

Figure 5:
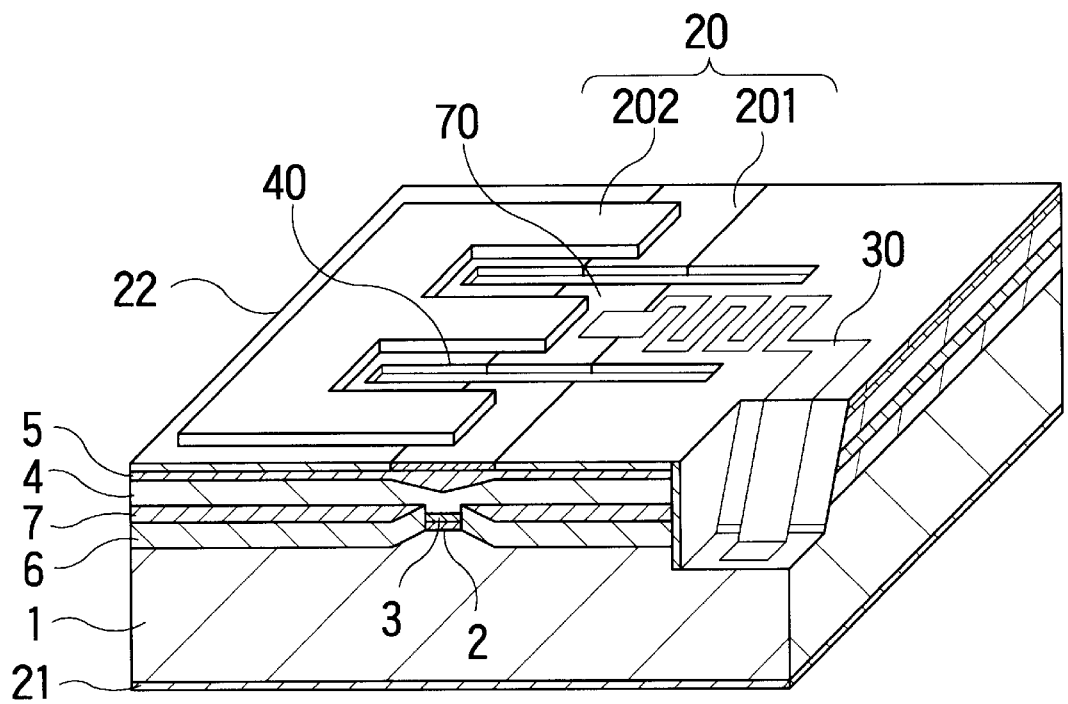
FIG. 5 is a perspective view showing a fourth embodiment according to the present invention, in which an effective phase shift DFB type semiconductor laser is shown.

FIG. 5 is a perspective view showing the fourth embodiment, in which the DFB type laser the same as that shown in FIG. 3, except the shape and position of the thin film resistance element is shown.

In the first through third embodiments, the characteristics are compensated for in the vicinity of the threshold current. On the other hand, when the laser is driven at as such a high bias voltage as about 100 mA, it is necessary to take the thermal effect into account. That is, the refractive index in the peripheral region in which current flows tends to rise due to Joule heat ($I^2R$), in comparison with that at the middle portion of the resonator in which a large leakage current exists. This rise in refractive index works in such a way that the carrier density effect can be canceled out. However, this phenomenon can be utilized in another way. In more detail, since the resistance of the shunt path is greatly high, it is possible to control the effective phase shift by the generated heat, that is, according to the position where the shunt path is concentrated to the resonator.

The feature according to the present invention is to form a shunt path 30 of Pt thin film resistance element (whose resistance increases with increasing temperature) on the insulating film 22 in such a way that the electrode portion 201 can be electrically connected to the semiconductor substrate 1. In the Pt thin film resistance element, the current flowing through the resistance element decreases with increasing temperature. The shunt path 30 is formed so as to be arranged in electrically parallel (shunt) to the stripe-shaped active layer 2.

The resonator is divided into three portions, and the divided portions are insulated electrically from each other. This electric insulation can be achieved by forming two grooves 40 each having such a depth as not to obstruct the waveguided light in the vicinity of the active layer. In addition, the shunt path (i.e., thin metallic film) 30 is connected to only the middle electrode portion thereof. That is, the thin film resistance element 30 is formed concentratively in the vicinity of the active layer in the phase shift region. The refractive index in the shift region is increased by the heat generated by this resistance element. At a low temperature, the heat quantity generated as described above is absorbed by a heat sink and therefore its influence is small. At a higher temperature, however, since the heat radiation is not effective, the temperature at the shift portion increases as compared with that at the peripheral portions. As a result, the refractive index changes relatively large, so that there exists a difference in phase shift between the shift portion and the peripheral portion.

In the case of the DFB type laser by which the light is outputted from a facet thereof, it is impossible to compensate both at the same time in the structure of this embodiment as already explained, since there exists trade-off relationship between the optical output (or slope efficiency) and the threshold current according to the change of the phase shift.

6th Embodiment

Figure 6:
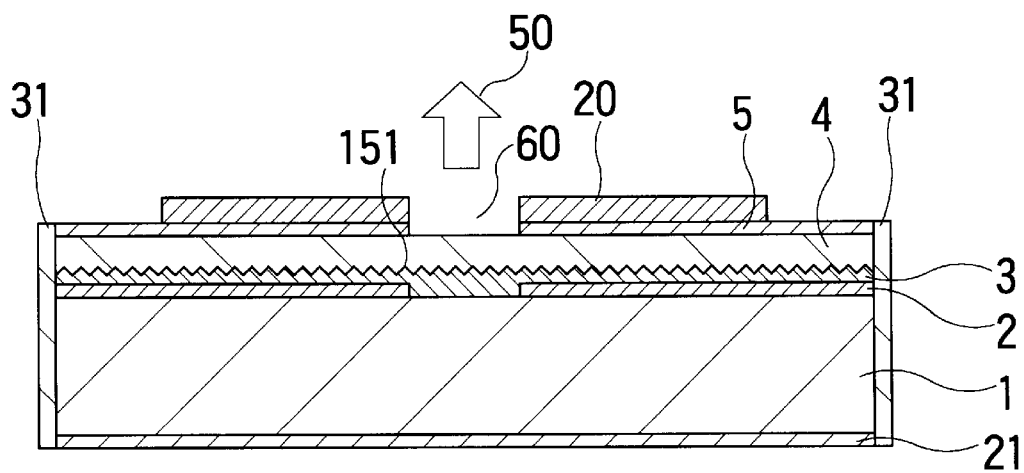
FIG. 6 is a cross-sectional view showing a fifth embodiment according to the present invention, in which a GCSEL (grating coupled surface emitting type laser) is shown.
Figure 7:
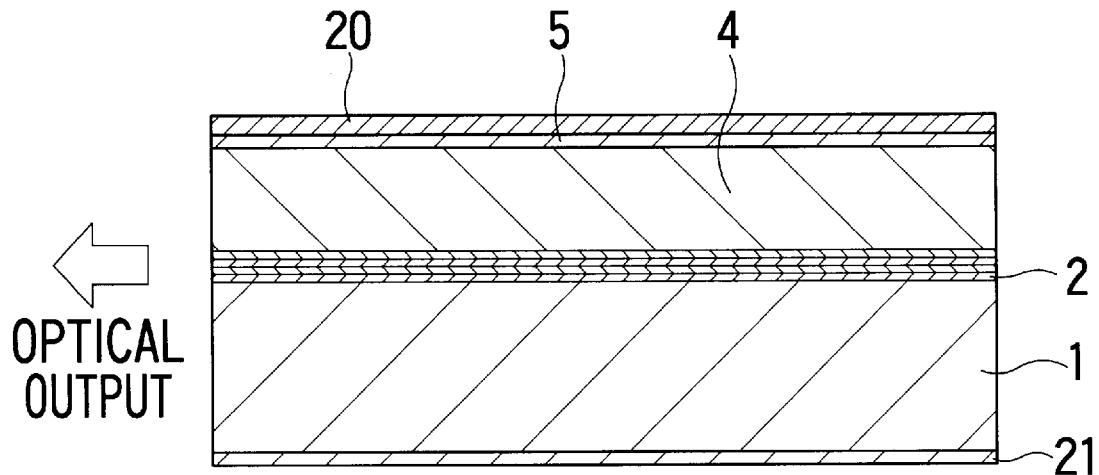
FIG. 7 is a cross-sectional view showing a prior art FP type laser.

FIG. 6 is a cross-sectional view showing the sixth embodiment of the present invention, in which a surface light emitting type(not the edge emitting type) laser is shown. In the semiconductor laser of this type, the radiation mode from the second-order gratings is used as the optical output. The radiation mode light from the second-order gratings is a sharp beam emitted perpendicularly to the semiconductor substrate. This laser is called GCSEL (grating coupled surface emitting laser). This laser shown in FIG. 6 is different from the DFB type laser shown in FIG. 4 in that the gratings 151 have second-order periods and a window 60 is opened to derive the vertical radiation mode output light 50. The structure other than the above is the same as with the case of the DFB type laser shown in FIG. 4. In the case of the λ/4 phase shift DFB type laser, the axial distribution of the radiation mode matches the distribution of the waveguide light, so that when the coupling coefficient κ is larger than 1.3, the optical output is stronger at the middle portion. In the case of the λ/8 phase shift radiation mode, however, the optical output is weaker at the middle portion. Therefore, it is possible to compensate for both the threshold current and the optical output at the same time by designing the phase shift region under the consideration of the temperature dependence of the threshold carrier density, in such a way that the phase shift rate is set to be about λ/8 at a low temperature and to be λ/4 at a higher temperature. In this GCSEL embodiment, therefore, the compensation effect is more large.

The module on which the light emitting element according to the present invention is mounted can be manufactured at a relatively low cost, so that the module can be used widely for the home optical communications systems.

Figure 12:
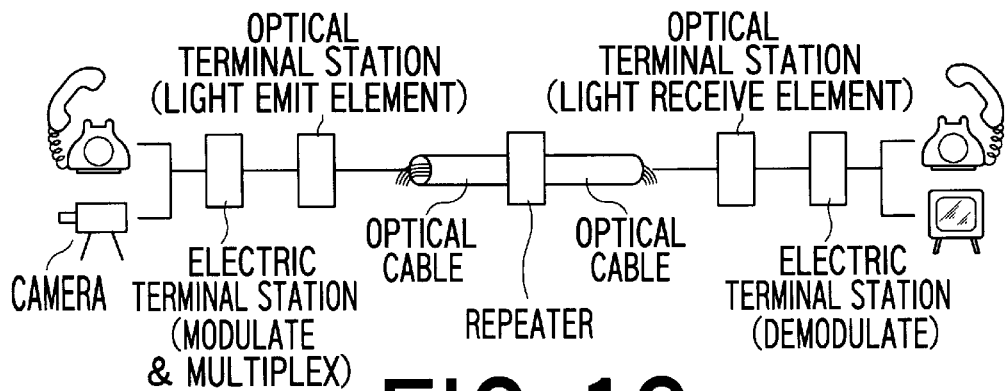
FIG. 12 is a schematic block diagram showing an optical fiber transmission system according to the present invention.

FIG. 12 is a block diagram showing an example of the optical fiber communications systems. In this system, various kinds of data such as sounds or images required to be transmitted are first converted into electrical signals on the transmission side; the converted electric signals are transduced into light intensity by use of the semiconductor laser; the transduced output light is transmitted to a remote place through an optical fiber; and the transmitted output light is converted into electric signals by use of an optical detector such as PIN or APD on the reception side to obtain the same sounds and/or images as those on the transmission side. In this system, the semiconductor laser according to the present invention can be used as the light emitting elements. In this case, it is possible to obtain a transmission system which is less in the temperature dependency.

Figure 13:
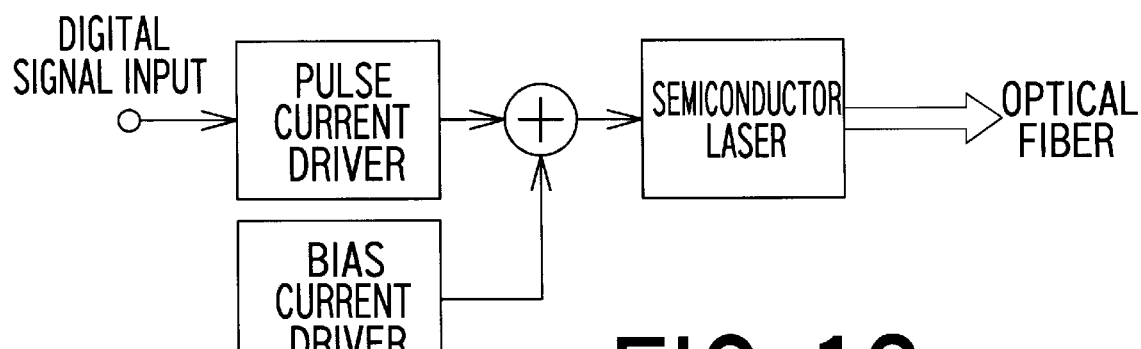
FIG. 13 is a block diagram showing an optical output stabilizing circuit according to the present invention.
Figure 14:
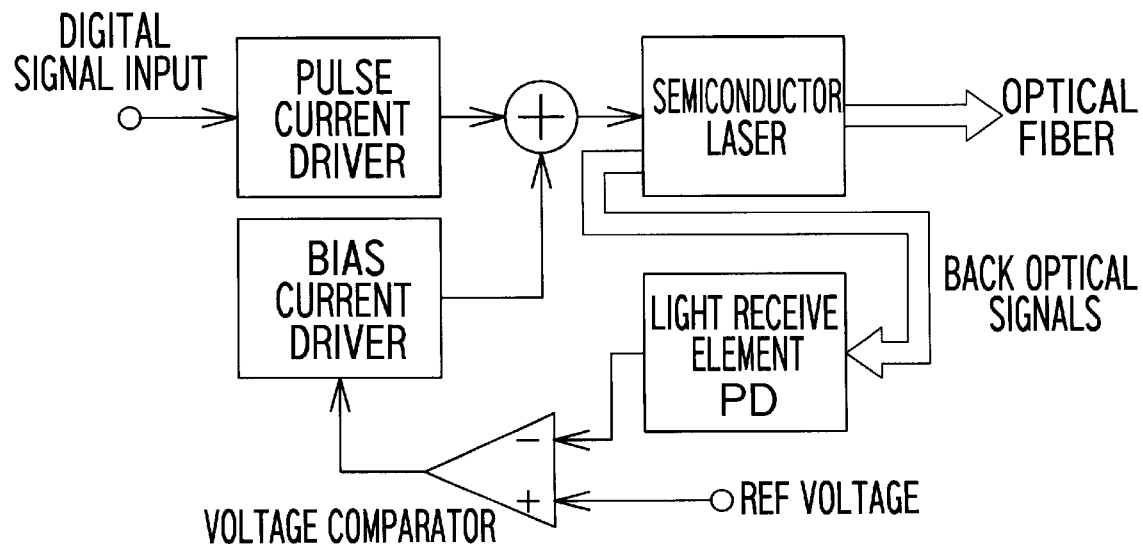
FIG. 14 is a block diagram showing a prior art optical output stabilizing circuit.

FIG. 13 is a block diagram showing the light transmission section using the semiconductor laser according to the present invention. FIG. 14 is a block diagram showing the prior art light transmission section. In FIG. 13, it is unnecessary to control the current of a bias current driver circuit by always monitoring part of the output light emitted from the rear side, which is different from the prior art case shown in FIG. 14. As a result, when the semiconductor light emitting element according to the present invention is used, it is possible to realize a simple and highly efficient transmission section of the optical communications system.

What is claimed is:

1. A semiconductor light emitting element, comprising:
   a semiconductor substrate (1);
   a plurality of semiconductor layers including an active layer (2) and formed on a first principal plane of said semiconductor substrate (1);
   a first electrode (20) formed on a surface of one of said semiconductor layers;
   a second electrode (21) formed on a second principal plane of said semiconductor substrate (1); and
   at least one shunt path (30) connected in parallel with the active layer (2) which emits light by current-injection, in such a way as to compensate for the fluctuation of the emitted light power from the active layer (2) caused by the change of the temperature.

2. The semiconductor light emitting element of claim 1, which further comprises a waveguide (3) having a grating (15), and wherein:
   said shunt path (30) is formed being branched from a part of said waveguide (3); and
   a difference in carrier density between said part of said waveguide (3) and the parts other than said part producing a difference in refractive index, said difference functions as an effective phase shift for the grating (15), in such a way that the fluctuation of the light emission. characteristics of the semiconductor light emitting element. caused by the temperature change be compensated for by the change of the amount of said effective phase shift caused by the temperature change.

3. The semiconductor light emitting element of claim 1, which further comprises a waveguide (3) having a grating (15), and wherein:
   said shunt path (30) is formed being concentrated at a part of said waveguide (3); and
   a difference in refractive index caused by heat generated by said shunt path (30) between said part of said waveguide (3) and parts other than said part of said waveguide can function as an effective phase shift for the grating (15), in such a way that the fluctuation of the light emission characteristics of the semiconductor light emitting element caused by the temperature change can be compensated for by the change of the amount of said effective phase shift caused by the temperature change.

4. The semiconductor light emitting element of claim 1, which further comprises a waveguide (3) having a grating (15), and wherein:
   an effective phase shift is generated for the grating (15) by forming a cutout portion in said active layer (2) in a direction of said waveguide (3); and
   the amount of said effective phase shift is further changed by causing a change of carrier density of said active layer (2) to produce a change of a difference in refractive index between said active layer (2) and the cutout portion of said active layer, in such a way that the fluctuation of the light emission characteristics of the semiconductor light emitting element caused by the temperature change can be compensated for by the change of the amount of said effective phase shift caused by the temperature change.

5. The semiconductor light emitting element of claim 1, which further comprises a waveguide (3) having a grating (15), and wherein:
   an effective phase shift is generated for the grating (15) by forming a part of an active layer where current is not injected in a direction of said waveguide (3); and
   the amount of said effective phase shift is further changed by causing change of carrier density of said active layer (2) to produce change of a difference in refractive index between the said part of the active layer where current is not injected and parts other than said part of the active layer, in such a way that the fluctuation of light emission characteristics of the semiconductor light emitting element caused by the temperature change can be compensated for by the change of the amount of the effective phase shift caused by the temperature change.

6. The semiconductor light emitting element of claim 1, which further comprises a waveguide (3) having second-order gratings (151).

7. The semiconductor light emitting element of claim 1, wherein change of the amount of said phase shift generated by said shunt path (30) is so controlled as to compensate for the fluctuation of threshold current of the semiconductor light emitting element caused by the temperature change.

8. The semiconductor light emitting element of claim 1, wherein change of the amount of said phase shift generated by said shunt path (30) is so controlled as to compensate for the fluctuation of intensity of light output from the semiconductor light emitting element caused by the temperature change.

9. A semiconductor light emitting element, comprising:
   a semiconductor substrate (1);
   a plurality of semiconductor layers including an active layer (2) and formed on a first principal plane of said semiconductor substrate (1);
   a first electrode (20) formed on a surface of one of said semiconductor layers;
   a second electrode (21) formed on a second principal plane of said semiconductor substrate (1); and
   a shunt path (30) connected in parallel with the active layer (2) which functions as emit light by current injection and formed as a metallic resistance element whose resistance increases with temperature increase, so as to compensate for the fluctuation of light emission characteristics of the active layer (2) caused by the change of the temperature.

10. The semiconductor light emitting element of claim 9, which further comprises a waveguide (3) having a grating (15), and wherein:
   said shunt path (30) is formed being branched from a part of said waveguide (3); and
   a difference in carrier density between said part of said waveguide (3) and the parts other than said part producing a difference in refractive index, said difference functions as an effective phase shift for the grating (15), in such a way that the fluctuation of the light emission characteristics of the semiconductor light emitting element caused by the temperature change be compensated for by the change of the amount of said effective phase shift caused by the temperature change.

11. The semiconductor light emitting element of claim 9, which further comprises a waveguide (3) having a grating (15), and wherein:
   said shunt path (30) is formed being concentrated at a part of said waveguide (3); and
   a difference in refractive index caused by heat generated by said shunt path (30) between said part of said waveguide (3) and parts other than said part of said waveguide can function as an effective phase shift for the grating (15), in such a way that the fluctuation of the light emission characteristics of the semiconductor light emitting element caused by the temperature change can be compensated for by the change of the amount of said effective phase shift caused by the temperature change.

12. The semiconductor light emitting element of claim 9, which further comprises a waveguide (3) having a grating (15), and wherein:
   an effective phase shift is generated for the grating (15) by forming a cutout portion in said active layer (2) in a direction of said waveguide (3); and
   the amount of said effective phase shift is further changed by causing a change of carrier density of said active layer (2) to produce a change of a difference in refractive index between said active layer (2) and the cutout portion of said active layer, in such a way that the fluctuation of the light emission characteristics of the semiconductor light emitting element caused by the temperature change can be compensated for by the change of the amount of said effective phase shift caused by the temperature change.

13. The semiconductor light emitting element of claim 9, which further comprises a waveguide (3) having a grating (15), and wherein:
   an effective phase shift is generated for the grating (15) by forming a part of an active layer where current is not injected in a direction of said waveguide (3); and
   the amount of said effective phase shift is further changed by causing change of carrier density of said active layer (2) to produce change of a difference in refractive index between the said part of the active layer where current is not injected and parts other than said part of the active layer, in such a way that the fluctuation of light emission characteristics of the semiconductor light emitting element caused by the temperature change can be compensated for by the change of the amount of the effective phase shift caused by the temperature change.

14. The semiconductor light emitting element of claim 9, which further comprises a waveguide (3) having second-order gratings (151).

15. The semiconductor light emitting element of claim 9, wherein change of the amount of said phase shift generated by said shunt path (30) is so controlled as to compensate for the fluctuation of threshold current of the semiconductor light emitting element caused by the temperature change.

16. The semiconductor light emitting element of claim 9, wherein change of the amount of said phase shift generated by said shunt path (30) is so controlled as to compensate for the fluctuation of intensity of light output from the semiconductor light emitting element caused by the temperature change.

17. A semiconductor light emitting element, comprising:
   a semiconductor substrate (1) grounded;
   a plurality of semiconductor layers including an active layer (2) and formed on a first principal plane of said semiconductor substrate (1);
   a first electrode (20) formed on a surface of one of said semiconductor layers;
   a second electrode (21) formed on a second principal plane of said semiconductor substrate (1); and
   a shunt path (30) formed as a metallic resistance element whose resistance increases with temperature increase, for electrically connecting said first electrode (20) to said semiconductor substrate (1), so as to compensate for the fluctuation of light emission characteristics of the active layer (2) caused by the change of the temperature.

18. The semiconductor light emitting element of claim 17, which further comprises a waveguide (3) having a grating (15), and wherein:
   said shunt path (30) is formed being branched from a part of said waveguide (3); and
   a difference in carrier density between said part of said waveguide (3) and the parts other than said part producing a difference in refractive index, said difference functions as an effective phase shift for the grating (15), in such a way that the fluctuation of the light emission characteristics of the semiconductor light emitting element caused by the temperature change be compensated for by the change of the amount of said effective phase shift caused by the temperature change.

19. The semiconductor light emitting element of claim 17, which further comprises a waveguide (3) having a grating (15), and wherein:
   said shunt path (30) is formed being concentrated at a part of said waveguide (3); and a difference in refractive index caused by heat generated by said shunt path (30) between said part of said waveguide (3) and parts other than said part of said waveguide can function as an effective phase shift for the grating (15), in such a way that the fluctuation of the light emission characteristics of the semiconductor light emitting element caused by the temperature change can be compensated for by the change of the amount of said effective phase shift caused by the temperature change.

20. The semiconductor light emitting element of claim 17, which further comprises a waveguide (3) having a grating (15), and wherein:

an effective phase shift is generated for the grating (15) by forming a cutout portion in said active layer (2) in a direction of said waveguide (3); and the amount of said effective phase shift is further changed by causing a change of carrier density of said active layer (2) to produce a change of a difference in refractive index between said active layer (2) and the cutout portion of said active layer, in such a way that the fluctuation of the light emission charateristics of the semiconductor light emitting element caused by the temperature change can be compensated for by the change of the amount of said effective phase shift caused by the temperature change.

21. The semiconductor light emitting element of claim 17, which further comprises a waveguide (3) having a grating (15), and wherein:

an effective phase shift is generated for the grating (15) by forming a part of an active layer where current is not injected in a direction of said waveguide (3); and the amount of said effective phase shift is further changed by causing change of carrier density of said active layer (2) to produce change of a difference in refractive index between the said part of the active layer where current is not injected and parts other than said part of the active layer, in such a way that the fluctuation of light emission characteristics of the semiconductor light emitting element caused by the temperature change can be compensated for by the change of the amount of the effective phase shift caused by the temperature change.

22. The semiconductor light emitting element of claim 17, which further comprises a waveguide (3) having second-order gratings (151).

23. The semiconductor light emitting element of claim 17, wherein change of the amount of said phase shift generated by said shunt path (30) is so controlled as to compensate for the fluctuation of threshold current of the semiconductor light emitting element caused by the temperature change.

24. The semiconductor light emitting element of claim 17, wherein change of the amount of said phase shift generated by said shunt path (30) is so controlled as to compensate for the fluctuation of intensity of light output from the semiconductor light emitting element caused by the temperature change.

25. An optical fiber transmission system, which comprises:

an optical transmission unit having a semiconductor light emitting element;

an optical fiber; and an optical reception unit, wherein said semiconductor light emitting element includes a semiconductor substrate (1), a plurality of semiconductor layers including an active layer (2) and formed on a first principal plane of said semiconductor substrate (1), a first electrode (20) formed on a surface of one of said semiconductor layers, a second electrode (21) formed on a second principal plane of said semiconductor substrate (1), and at least one shunt path (30) connected in parallel with the active layer (2) which emits light by current-injection in such a way as to compensate for a fluctuation of the emitted light power from the active layer (2) caused by a change of temperature.

26. An optical fiber transmission system, which comprises:

an optical transmission unit having a semiconductor light emitting element;

an optical fiber; and an optical reception unit, said semiconductor light emitting element includes a semiconductor substrate (1), a plurality of semiconductor layers including an active layer (2) and formed on a first principal plane of said semiconductor substrate (1), a first electrode (20) formed on a surface of one of said semiconductor layers, a second electrode (21) formed on a second principal plane of said semiconductor substrate (1), and a shunt path (30) connected in parallel with the active layer (2) which functions to emit light by current-injection and formed as a metallic resistance element whose resistance increases with temperature increase, so as to compensate for a fluctuation of light emission characteristics of the active layer (2) caused by a change the temperature.

27. An optical fiber transmission system, which comprises:

an optical transmission unit having a semiconductor light emitting element;

an optical fiber; and an optical reception unit, said semiconductor light emitting element includes a semiconductor substrate (1) grounded, a plurality of semiconductor layers including an active layer (2) and formed on a first principal plane of said semiconductor substrate (1), a first electrode (20) formed on a surface of one of said semiconductor layers, a second electrode (21) formed on a second principal plane of said semiconductor substrate (1), and a shunt path (30) formed as a metallic resistance element whose resistance increases with temperature increase, for electrically connecting said first electrode (20) to said semiconductor substrate (1), so as to compensate for a fluctuation of light emission characteristics of the active layer (2) caused by a change of the temperature.

* * * * *